United States Patent
Tokiwa

(10) Patent No.: US 7,864,586 B2
(45) Date of Patent: Jan. 4, 2011

(54) NON-VOLATILE SEMICONDUCTOR MEMORY DEVICE

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/277,698

(22) Filed: Nov. 25, 2008

(65) Prior Publication Data

US 2009/0154237 A1 Jun. 18, 2009

(30) Foreign Application Priority Data

Dec. 12, 2007 (JP) .............................. 2007-320259

(51) Int. Cl.
*G11C 16/04* (2006.01)
*G11C 5/14* (2006.01)

(52) U.S. Cl. ............................ 365/185.18; 365/185.03; 365/185.17; 365/189.09

(58) Field of Classification Search ............ 365/189.09, 365/185.18
See application file for complete search history.

(56) References Cited

U.S. PATENT DOCUMENTS

| | | | | |
|---|---|---|---|---|
| 5,991,221 A | * | 11/1999 | Ishikawa et al. | ............. 365/226 |
| 6,480,415 B2 | * | 11/2002 | Makuta et al. | ......... 365/185.09 |
| 7,388,782 B2 | | 6/2008 | Tokiwa | |
| 7,463,515 B2 | * | 12/2008 | Shirakawa et al. | ...... 365/185.03 |
| 7,652,905 B2 | * | 1/2010 | Shen et al. | ..................... 365/63 |
| 7,652,944 B2 | * | 1/2010 | Iwaya | ......................... 365/226 |
| 7,688,632 B2 | * | 3/2010 | Nagashima et al. | .... 365/185.19 |
| 2001/0003509 A1 | | 6/2001 | Hosono et al. | |
| 2006/0279993 A1 | * | 12/2006 | Shibata | .................. 365/185.17 |
| 2007/0064495 A1 | | 3/2007 | Shibata | |
| 2007/0147144 A1 | | 6/2007 | Tokiwa | |
| 2008/0253192 A1 | | 10/2008 | Tokiwa | |

* cited by examiner

*Primary Examiner*—Son L Mai
(74) *Attorney, Agent, or Firm*—Oblon, Spivak, McClelland, Maier & Neustadt, L.L.P.

(57) ABSTRACT

A non-volatile semiconductor memory device includes: a memory cell array with electrically rewritable and non-volatile memory cells arranged therein; a first register group configured to store control data used for controlling memory operations; an adjusting data storage area defined in the memory cell array so as to store adjusting data used for adjusting the control data; and a second register group configured to store the adjusting data read from the adjusting data storage area.

18 Claims, 22 Drawing Sheets

NON-VOLATILE SEMICONDUCTOR MEMORY DEVICE

CROSS-REFERENCE TO RELATED APPLICATION

This application is based on and claims the benefit of priority from the prior Japanese Patent Application No. 2007-320259, filed on Dec. 12, 2007, the entire contents of which are incorporated herein by reference.

BACKGROUND OF THE INVENTION

1. Field of the Invention

This invention relates to an electrically rewritable and non-volatile semiconductor memory device (EEPROM).

2. Description of the Related Art

A NAND-type flash memory is well-known as one of EEPROMs. The NAND-type flash memories are, in consideration of the property variations generated in the manufacturing processes, shipped after writing various voltage setting values used in write, erase and read operations into a ROM fuse area in the chip based on the result of the wafer test. When users use the memories, the fuse ROM data are automatically read out every power-on reset time. As a result, suitable voltage setting values are set in registers and used in accordance with write, erase and read operations (refer to, for example, JP-A-2001-176290).

Explaining in detail, what are written in the ROM fuse area and read out to be held in the registers are data such as voltage trimming data used as control data of a voltage generating circuit used for generating various voltages. That is, assuming that a voltage range is set as an adjustable range, voltage trimming data are stored in the registers to be used for suitably setting the output voltages of the voltage generating circuit.

As the chip size is shrunk and data multiplication are progressed in a flash memory, and the number of voltage trimming data becomes larger, there will be increased not only the capacity and area of the ROM fuse area but also the capacity and area of the registers used for storing the voltage trimming data read from the ROM fuse area. In consideration of this situation, there have been provided some ideas for reducing the capacity and area of the ROM fuse area and registers with arithmetic operations introduced for reducing the number of trimming data to be held (for example, JP-A-2007-87513, JP-A-2006-344280 and JP-A-2007-179594).

On the other hand, users are not allowed to freely rewrite the ROM fuse area. Therefore, in case the memory properties are varied and the most suitable voltages are varied as a result of that the flash memory is used for a long time, there is no options in the conventional flash memories for dealing with the situation.

SUMMARY OF THE INVENTION

According to an aspect of the present invention, there is provided a non-volatile semiconductor memory device including:

a memory cell array with electrically rewritable and non-volatile memory cells arranged therein;

a first register group configured to store control data used for controlling memory operations;

an adjusting data storage area defined in the memory cell array so as to store adjusting data used for adjusting the control data; and a second register group configured to store the adjusting data read from the adjusting data storage area.

According to another aspect of the present invention, there is provided a non-volatile semiconductor memory device including:

a memory cell array with electrically rewritable and non-volatile memory cells arranged therein;

a voltage generating circuit configured to generate multiple voltages required correspondingly to the memory operations;

a first register group configured to store voltage trimming values supplied to the voltage generating circuit; and a second register group configured to store voltage adjusting values used for adjusting the voltage trimming values.

DETAILED DESCRIPTION OF THE EMBODIMENTS

Illustrative embodiments of this invention will be explained with reference to the accompanying drawings below.

Figure 1:
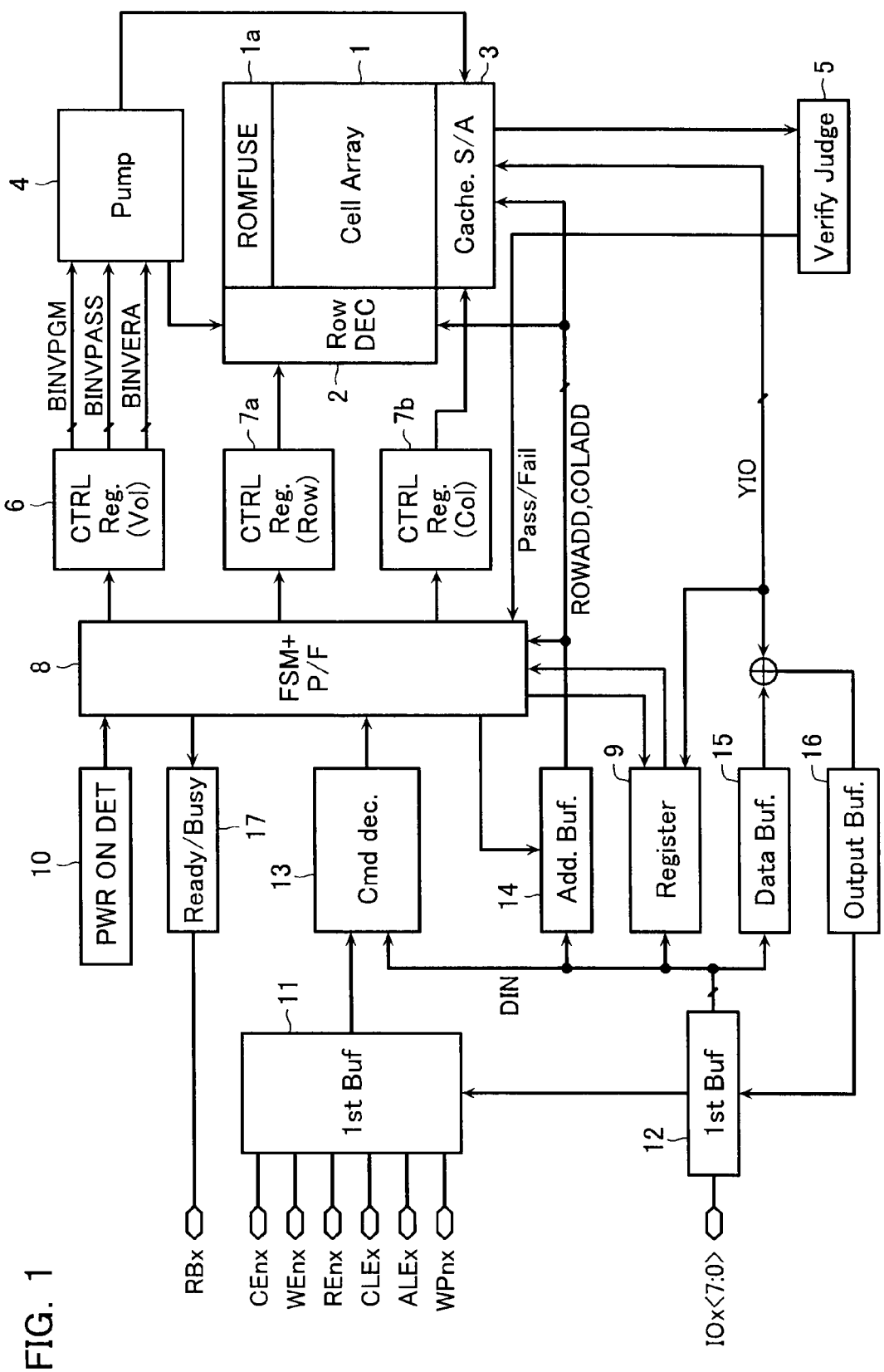
FIG. 1 shows a block configuration of a NAND-type flash memory in accordance with an embodiment of the present invention.
Figure 2:
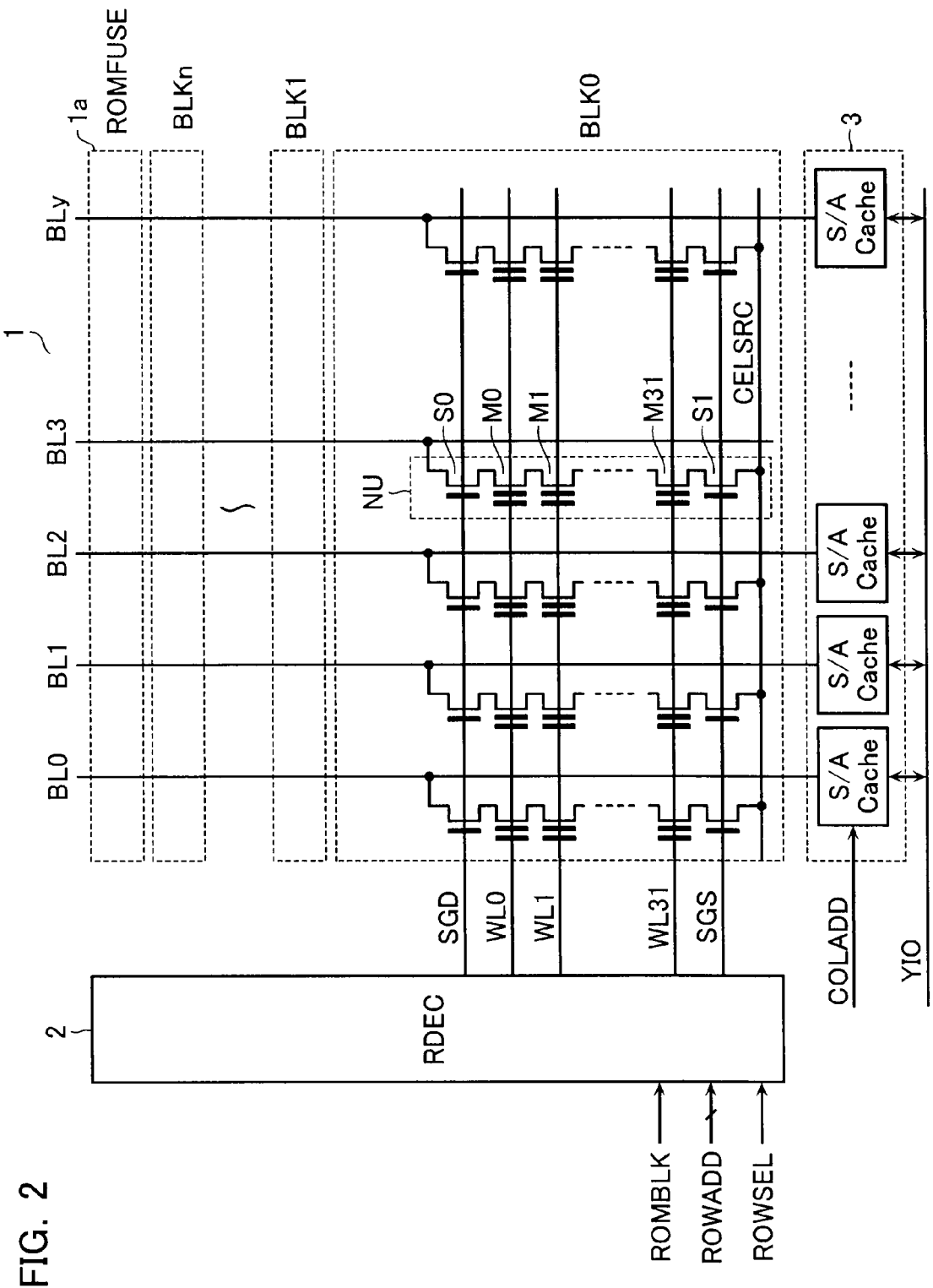
FIG. 2 shows the memory cell array in the flash memory.

FIG. 1 shows a functional block configuration of a NAND-type flash memory in accordance with an embodiment, and FIG. 2 shows the cell array of the memory core portion. Memory cell array 1 is, as shown in FIG. 2, formed of NAND cell units (i.e., NAND strings) NU arranged therein, in each of which electrically rewritable and non-volatile memory cells (thirty two cells in this case) M0-M31 are connected in series.

One ends of the NAND cell units NU are coupled to bit lines BLi (i=0~y) via select gate transistors S0 while the other ends are coupled to a common source line CELSRC via select gate transistors S1. Control gates of the memory cells M0-M31 are coupled to word lines WL0-WL31, respectively; and gates of the select gate transistors S0 and S1 to select gate lines SGD and SGS, respectively.

A set of NAND cell units NU arranged in the word line direction constitutes a block serving as an erase unit. As shown in FIG. 2, a plurality of blocks, BLK (BLK0-BLKn), are arranged in the bit line direction. Independently from these blocks, which users use, ROM fuse area 1a is prepared for serving as an initial setup data storage area. In this ROM fuse area 1a, various initial setup data to be used in association with memory operations are written at a shipping time.

Explaining in detail, the initial setup data include voltage setting value data (i.e., "voltage trimming value data"), timing code value data such as timing setting value used for timing-control of various operations, and the like. Users are usually allowed to only read this ROM fuse area 1a, and forbidden to erase or write this area.

Although there is shown here such an example that initial setup data storage area is defined in the memory cell array, the ROM fuse area may be disposed independently of the memory cell array for storing initial setup data.

Disposed on one ends of the bit lines BL are sense amplifier (serving as cache) circuit 3 serving for reading and writing cell data; and disposed on one ends of the word lines WL are row decoder 2 for selectively driving the word lines and select gate lines.

Data will be selectively transferred between the sense amplifier & cache circuit 3 and data bus YIO in accordance with column address "COLADD" supplied from address buffer 14. Row decoder 2 receives input signals (row address signal "ROWADD", ROM fuse address signal "ROMBLK" and row decoder activating signal "ROWSEL") from the address buffer 14, so that driving timings of the block selection and word line selection are decided.

Command, address and data are input via input buffer 12 while various external control signals (chip enable signal CEnx, write enable signal WEnx, read enable signal REnx, command latch enable signal CLEx, address latch enable signal ALEx, write-protect signal WPnx and the like) are input via input buffer 11.

Command is decoded in command decoder 13 and transferred to state machine 8 serving as an internal control circuit. A certain part of state machine 8 is constructed to do power-on reset operation on receipt of the power-on signal generated from power-on detecting circuit 10 as a trigger. As a result, data read of the ROM fuse block (ROMFUSE) 1a is executed, and the read data are stored in certain registers. In detail, voltage setting data are stored in register circuit 6, and supplied to control the output voltage of the high voltage generating circuit 4.

Addresses are input to address buffer 14, and then transferred to row decoder 2 and column gates via control register circuits 7a and 7b under the control of state machine 8. Write data are input via data buffer 15, and loaded in the sense amplifier circuit 3 while read data in the sense amplifier circuit 3 are output to the external via data buffer 16.

In order to generate various voltages necessary for the respective operation modes, there is prepared high voltage generating circuit 4, which generates certain high voltages in accordance with instructions supplied from the state machine 8 via control register circuit 6.

Attached to the sense amplifier circuit 3 is verify-judgment circuit 5, which serves for verify-judging data write based on the data latched in the sense amplifier circuit 3.

Further, this embodiment has the following features: (1) with respect to the "voltage trimming value data" read out the ROM fuse area 1a, there is prepared an area (i.e., voltage adjusting data storage area) set in a user-accessible area in the memory cell array, which serves for storing "voltage adjusting value data" used for minutely adjusting the "voltage trimming value data" in accordance with the using history of the memory; (2) It is executed such a preliminary read operation prior to an actual read, write or erase operation that the voltage adjusting value data are read out and held in certain registers; and (3) the voltage trimming value data read out the ROM fuse area are subjected to an arithmetic operation with the voltage adjusting value data, and minutely adjusted to be supplied to the high voltage generating circuit.

The above-described voltage adjusting data are stored as rewritable ones, for example, for every page in accordance with the number of fail bits, the number of write cycles, permissible bad bit flags and the like. As a result, the voltage trimming values written at the memory shipping time may be used as minutely adjusted and suitable values, so that it becomes possible to secure the reliability of the flash memory for a long time.

Figure 3:
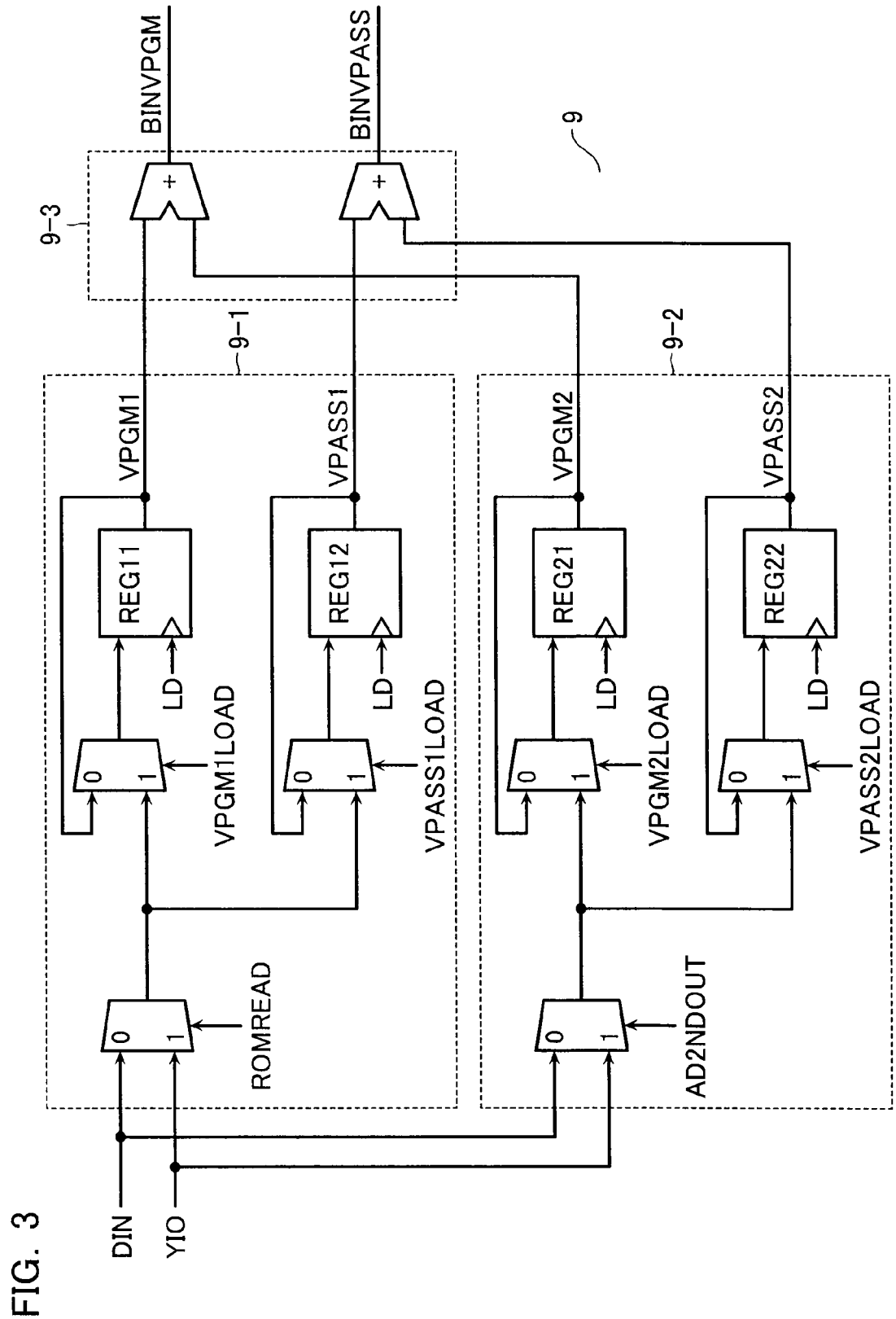
FIG. 3 shows the register 9 in the flash memory.

To make the above-described minute voltage adjustment possible, register circuit 9 shown in FIG. 1 is, for example extracting only the portion related to the voltage trimming, formed as shown in FIG. 3. That is, the register circuit 9 has first register group 9-1, which store various "voltage trimming values" automatically read from the ROM fuse area 1a every power-on reset time, and second register group 9-2, which store "voltage adjusting values" read from the cell array area in accordance with address input.

In this example, two resisters REG11 and REG12 are typically shown in the first register group 9-1 for storing voltage trimming values VPGM1 (used for generating write voltage applied to a selected word line) and VPASS1 (used for generating write-pass voltage applied to non-selected word lines), respectively, while two registers REG21 and REG22 are shown in the second register group 9-2 for storing voltage adjusting values VPGM2 (used for minutely adjusting VPGM1) and VPASS2 (used for minutely adjusting VPASS1), respectively.

The voltage setting values (i.e., voltage trimming values) held in the first register group 9-1 and the voltage adjusting value held in the second register group 9-2 are subjected to an operation (in detail, addition operation) in arithmetic operation part 9-3, so that minutely adjusted voltage trimming values BINVPGM and BINVPASS are generated. The arithmetic operation part 9-3 may be formed in the state machine 8.

Figure 4:
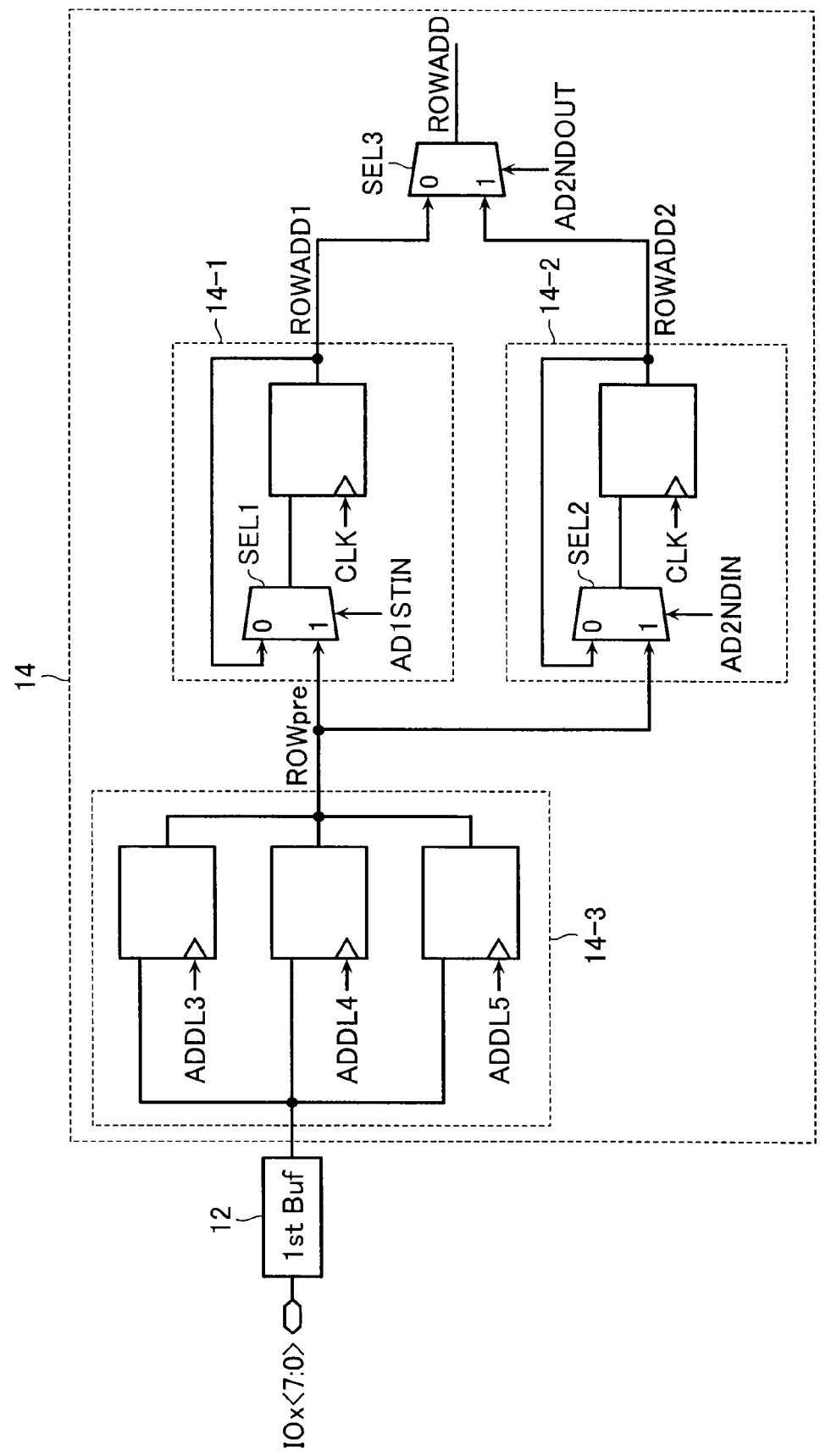
FIG. 4 shows the address buffer 4 in the flash memory.

To make the above-described voltage adjustment possible, it is in need of using an additional address cycle for reading the voltage adjusting data in addition to the normal read/write/erase cycles. Therefore, as shown in FIG. 4, address buffer resister 14 is formed of first address register part 14-1 used in the normal operation and second address register part 14-2 used for storing address for reading the voltage adjusting data.

The details of this embodiment will be explained below.

Figure 5:
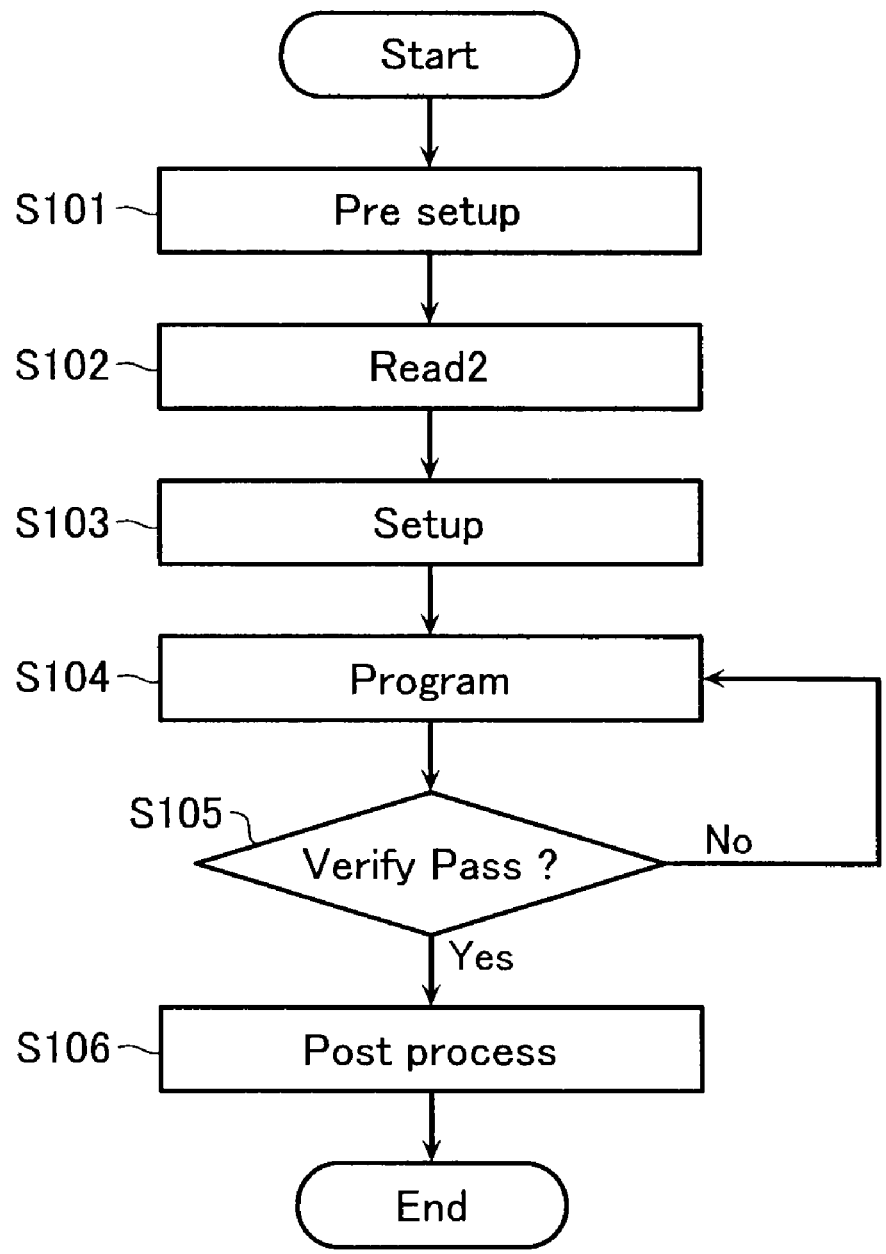
FIG. 5 shows a write sequence (1) of the flash memory.

FIG. 5 shows a write sequence (1). As a power-on reset operation, data of the ROM fuse area 1a are read out and transferred to and loaded in the first register group 9-1. At a pre-setup step (step S101), registers used for operations are initialized, and high voltage generating circuit is made ready for boosting operation.

Then, the voltage adjusting values in the voltage adjusting data storage area in the cell array are read out (step S102). The read out data are transferred to and held in the second register group 9-2 in the register circuit 9.

At the following setup step S103, state machine 8 calculates and outputs adjusted trimming values based on the voltage trimming values read out in the power-on reset operation and stored in the first register group 9-1 and the voltage adjusting values stored in the second register group 9-2. That is, in the example shown in FIG. 3, adding voltage adjusting values (VPGM2 and VPASS2) to the write voltage trimming value (VPGM1) and write-pass voltage trimming value (VPASS1), respectively, minutely adjusted write voltage trimming value BINVPGM and minutely adjusted write-pass voltage trimming value BINVPASS and generated. These adjusted trimming data are output from the state machine 8 to be supplied to the high voltage generating circuit 4 as control data via control register circuit 6 for generating necessary write voltage and write-pass voltage.

In practice, many kinds of voltage trimming values and the corresponding voltage adjusting values are stored in addition to the above-described data in the register circuit 9, and the same operations as described above are performed.

Thereafter, write (i.e., program) is performed (step S104). Here, "write" includes a write voltage applying operation for each page and a verify-read operation for verifying the write state. Then, write completion judgment is performed (step S105). These write voltage application and verify-read will be repeated until when the write completion is judged for one page.

After judging the write completion, a post process (including discharging word lines, setting status register and the like) is performed (step S106). When the continuous operations end, status register 17 shown in FIG. 1 outputs "ready state" signal to the pin PBx.

Figure 6:
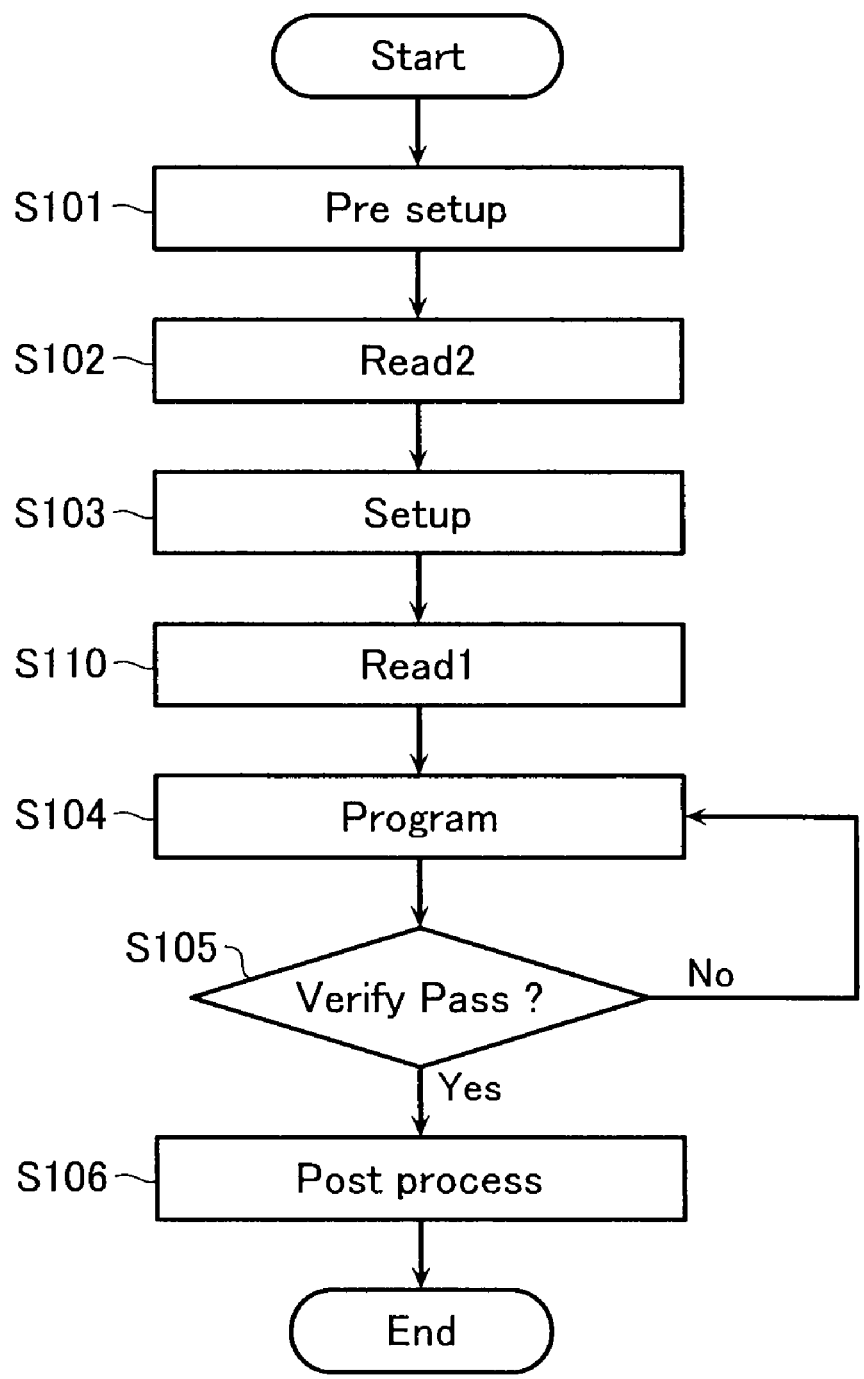
FIG. 6 shows another write sequence (2) of the flash memory.
Figure 7:
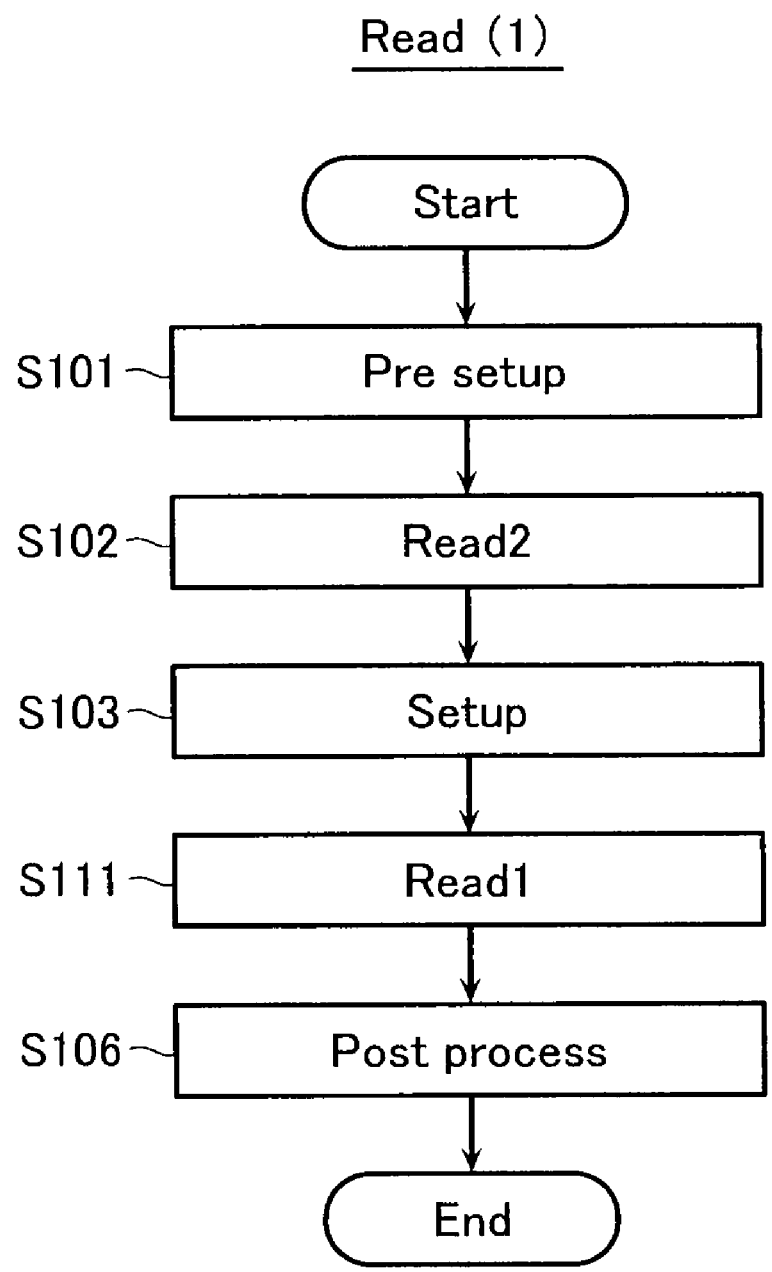
FIG. 7 shows a read operation of the flash memory.
Figure 8:
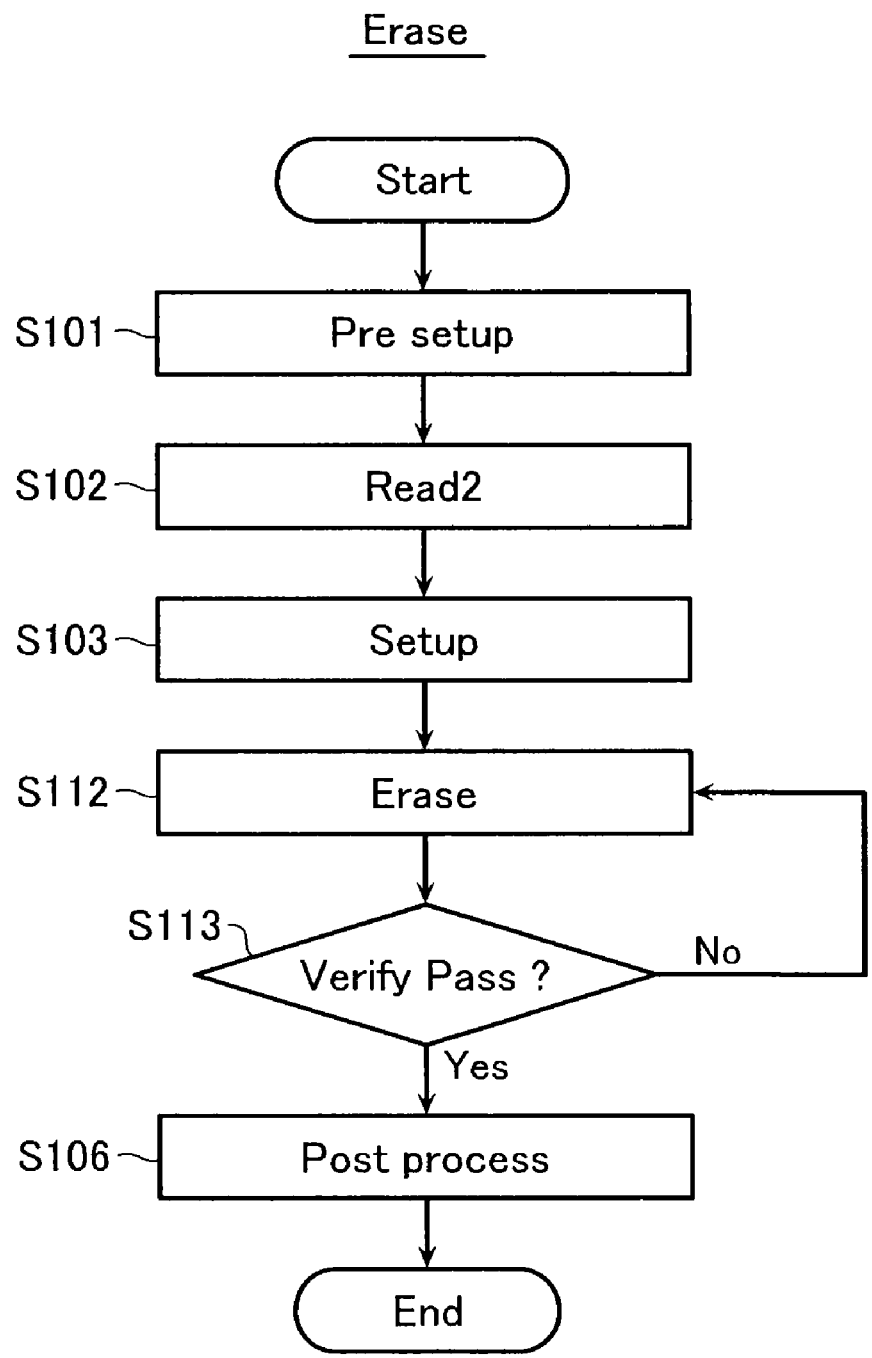
FIG. 8 shows an erase sequence of the flash memory.

FIG. 6 shows another write sequence (2); FIG. 7 shows a read operation; and FIG. 8 shows an erase sequence. In these drawings, the same steps as those shown in FIG. 5 are designated by the same reference symbols as those shown in FIG. 5. That is, pre-setup (step S101), voltage trimming value data read (step S102) and setup (step S103) are in common to each other.

The write sequence shown in FIG. 6 is that of, for example, four-level data writing. Write step S104 is the upper page write step, and previously to this step, the lower page read operation is performed for reading out the lower page data, which has already been written (step S110). If necessary, another read operation may be performed for reading cell's data of a non-selected word line disposed adjacent to a selected word line corresponding to the write address. To remove the interference between adjacent cells, it is often required to do such the operation.

At the setup step S103 of the read operation shown in FIG. 7, for example, read-pass voltage Vread to be applied to non-selected word lines is minutely adjusted, and then read operation is performed (step S111). At the setup step S103 of the erase operation shown in FIG. 8, for example, erase voltage Vera is minutely adjusted, and then erase operation is performed with the adjusted erase voltage (step S112). Erase operation includes erase voltage applying and erase-verify operation. The erase operation will be repeated until when it is confirmed that an erase unit has been erased collectively.

In the above-described operation flows, the order of the combination of steps S102, S103 and step S101 may be reversed.

Figure 9:
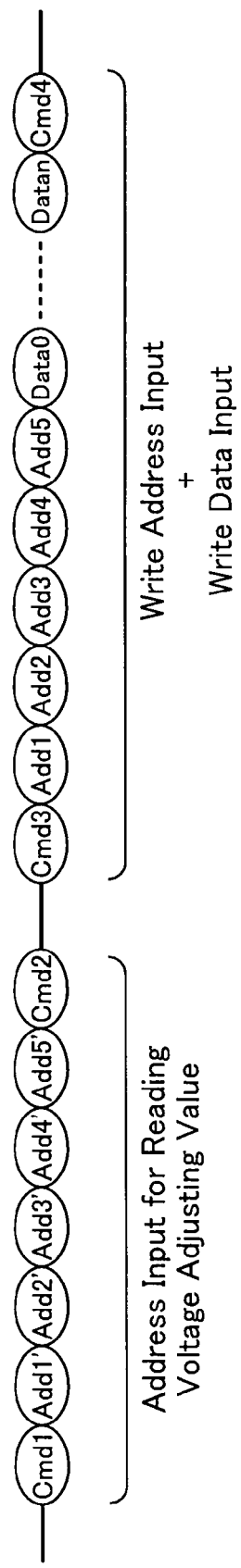
FIG. 9 shows a command sequence used at a write time.
Figure 10:
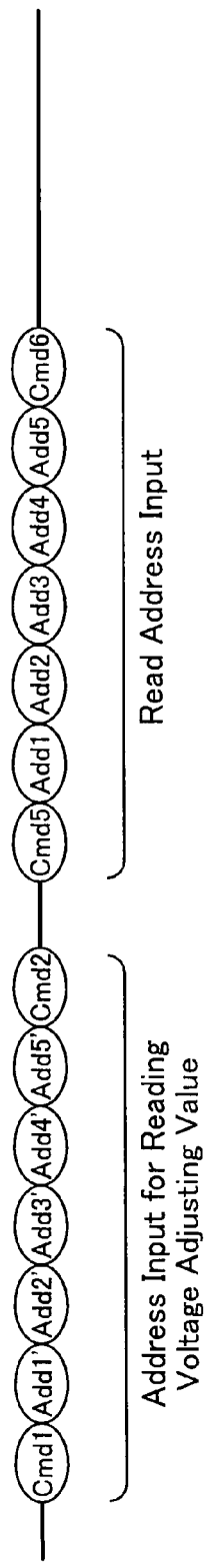
FIG. 10 shows a command sequence used at a read time.
Figure 11:
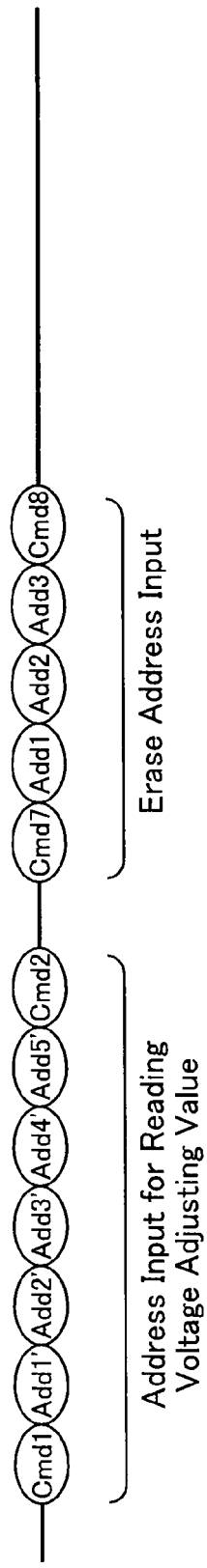
FIG. 11 shows a command sequence used at an erase time.

FIGS. 9 to 11 show command sequences adapted to the above-described operations. In these examples, "address input" is executed as five times sector address inputs.

FIG. 9 shows a case of the write sequence shown in FIG. 5 or FIG. 6. Sector addresses Add1'-Add5' sandwiched by commands Cmd1 and Cmd2 designate the read address input cycle for reading the voltage adjusting value data. These read addresses are, as shown in FIG. 4, latched in the address latch part 14-3 with address latch signals ADDL3-ADDL5, and then selected by selector SEL2 to be transferred to and held in the second register part 14-2.

In the successive address input cycle, command Cmd3 is input, and write addresses Add1-Add5 are input to designate a write unit (for example, one page), following it write data Data0-n are input, and finally write execute command Cmd4 is input. After this write address input cycle, state machine 8 executes the data write.

The write addresses are latched in the address latch part 14-3, and then selected by selector SEL1 to be transferred to and held in the first register part 14-1. Either one of outputs ROWADD1 and ROWADD2 of the first and second address register parts 14-1 and 14-2 is selected via selector SEL3 and transferred to the row decoder.

That is, at the voltage adjusting value read step S102 (shown in FIG. 5 or FIG. 6), the output ROWADD2 of the second address register part 14-2 is transferred to the row decoder, and voltage adjusting value data is read out. The read out voltage adjusting value data is held in the second register group 9-2 shown in FIG. 3.

FIG. 10 shows a command sequence of the read operation shown in FIG. 7. The initial address input cycle for reading the voltage adjusting value data is the same as that shown in FIG. 9. Following it, read command Cmd5, read addresses Add1-Add5 and read execute command Cmd6 are input, and then the read operation is controlled by the state machine 8.

FIG. 11 shows a command sequence of the erase sequence shown in FIG. 8. The initial address input cycle for reading the voltage adjusting value data is the same as that shown in FIG. 9. Following it, erase command Cmd7, erase addresses Add1-Add3 and erase execute command Cmd8 are input, and then the erase sequence will be controlled by state machine 8.

The address latch operations in the address cycles for reading the voltage adjusting value data and read data latch operations for latching the voltage adjusting value data shown in FIG. 10 and FIG. 11 are the same as the example shown in FIG. 9.

Figure 12:
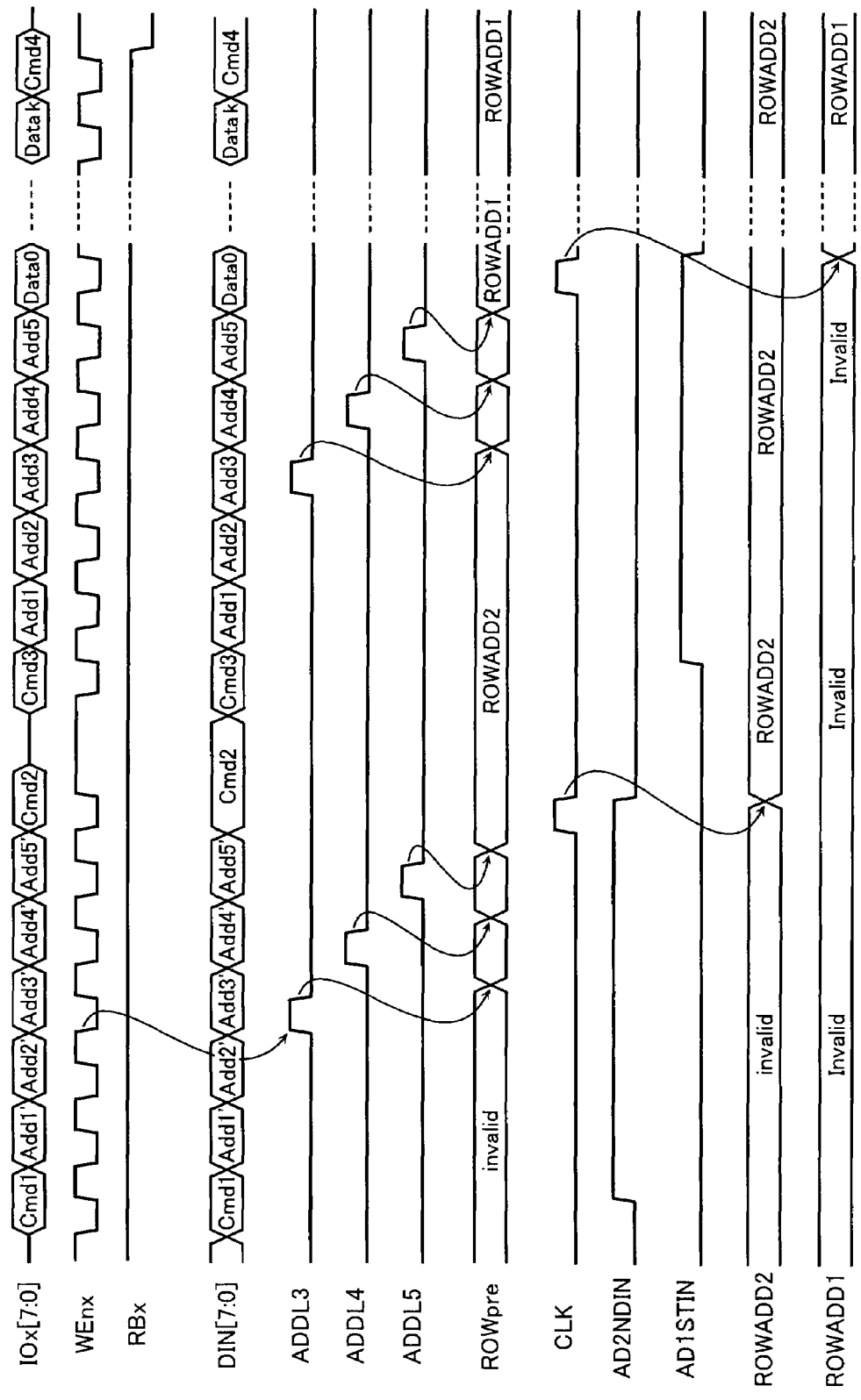
FIG. 12 shows a detailed operation timing chart in the command sequence used at the write time.

FIG. 12 shows an operation timing chart corresponding to the command sequence shown in FIG. 9. Commands and voltage adjusting data read addresses are input as Cmd1/Add1'-Add5'/Cmd2 synchronously with write enable signal WEn. The voltage adjusting value read addresses are latched in the second address register part 14-2 as ROWADD2 with select signal AD2NDIN="H" and clock CLK="H" set by commands Cmd1 and Cmd2, respectively.

In the successive write address input cycle, write addresses are latched in the first address register part 14-1 as ROWADD1 with select signal AD1STIN="H" and clock CLK="H" set by command Cmd3.

Figure 13:
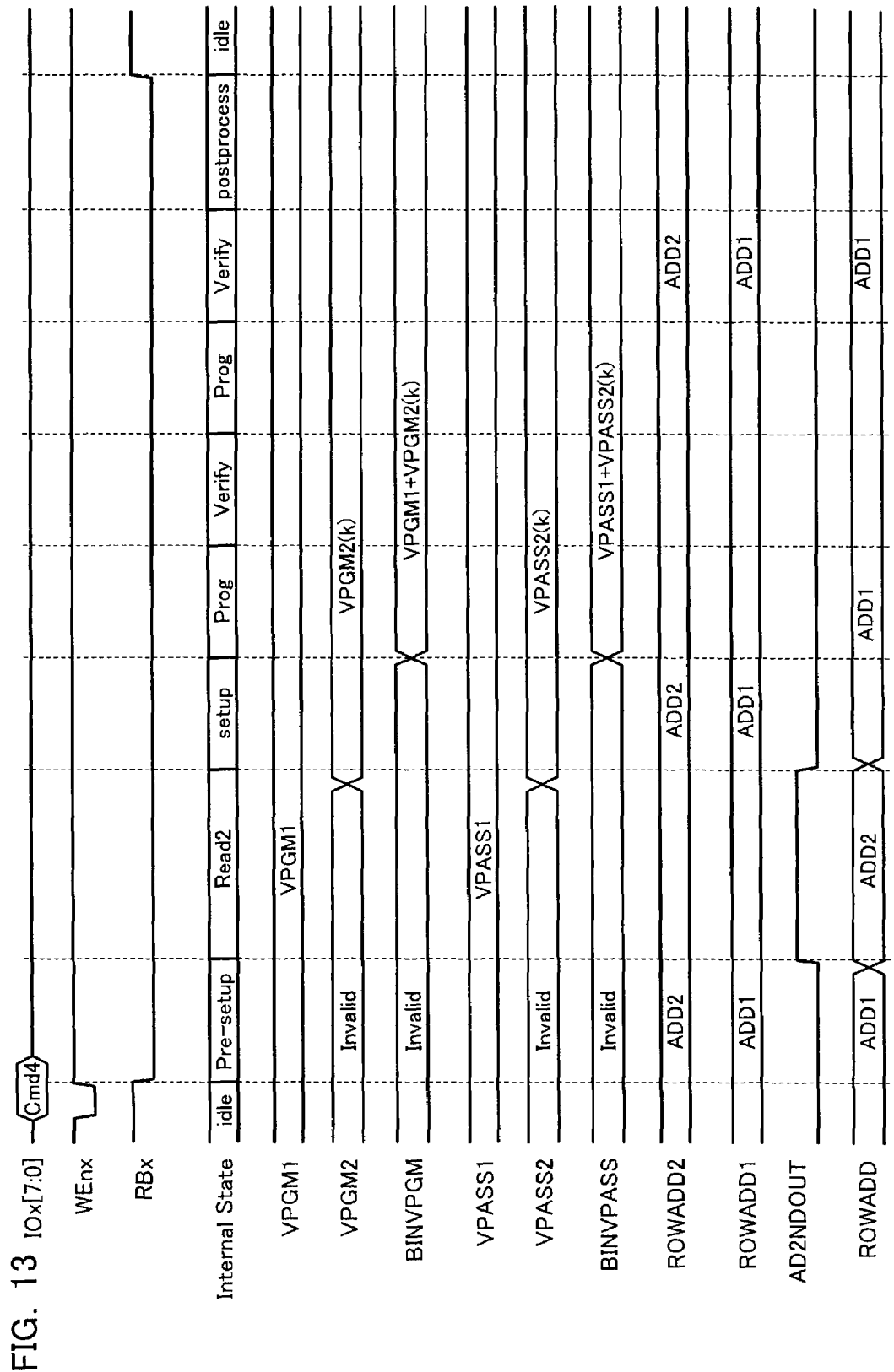
FIG. 13 shows an operation timing chart after the write execute command in the write sequence shown in FIG. 5.

FIG. 13 shows an operation timing chart after the write execute command Cmd4 shown in FIG. 12. "Internal State" designates the operation states controlled by state machine 8. As described above, "pre-setup" is performed, following it voltage adjusting value read operation "Read2" is performed, and then the voltage trimming value data will be minutely adjusted in the following "setup" operation. For example, minutely adjusting values VPGM2(k) and VPASS2(k) are added to write voltage trimming value VPGM1 and write pass trimming value VPASS1, respectively, so that adjusted and suitable trimming values will be generated. Here, suffix "k" designates a page address of the write address. Therefore, VPGM(k) designates k-page voltage adjusting value.

Write (Prog.) and write-verify (Verify) are repeated with the write voltage and write pass voltage trimmed by the adjusted trimming values. When one page data write has been completed, the write sequence ends through "post-process".

Figure 14:
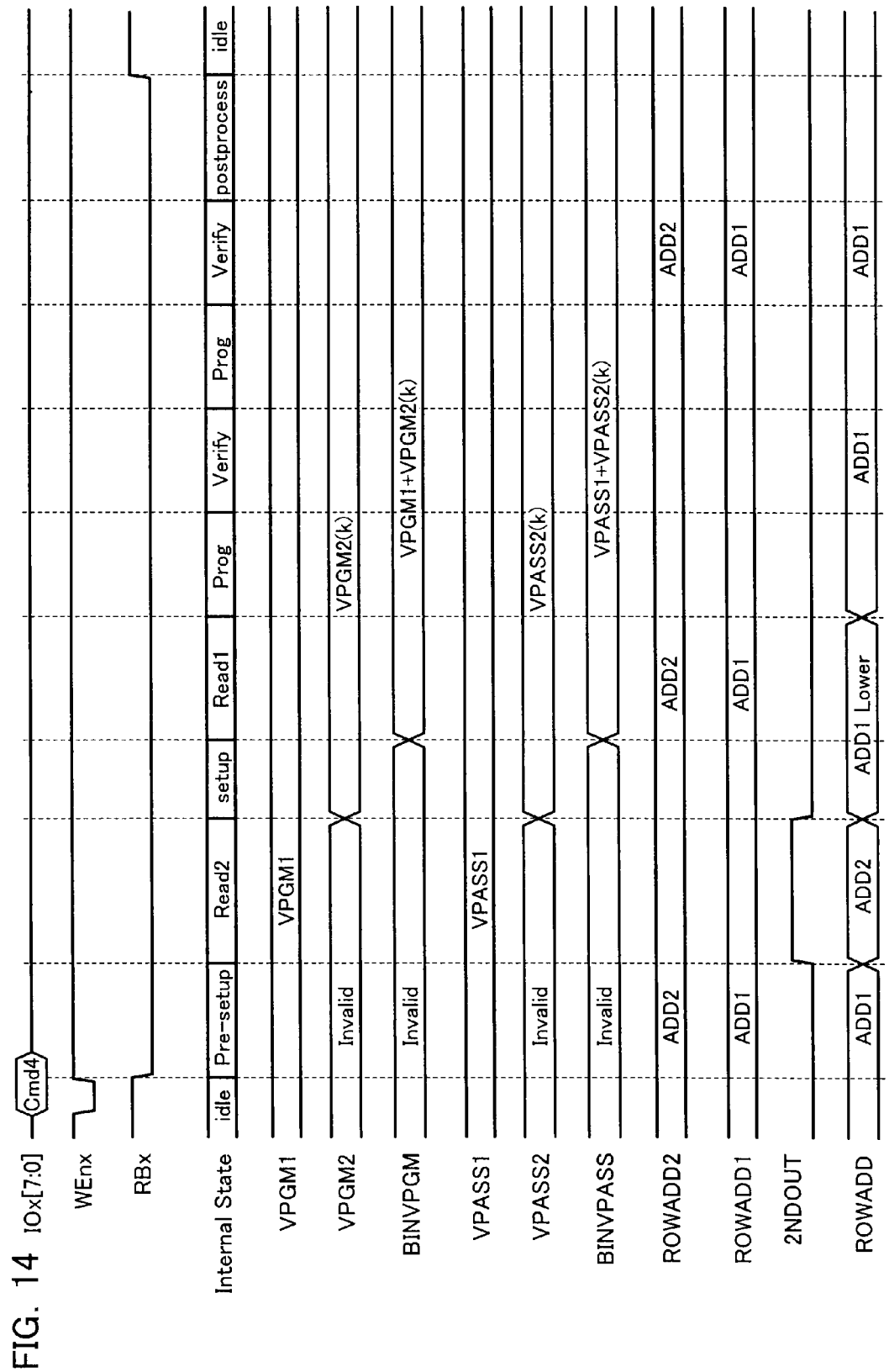
FIG. 14 shows an operation timing chart after the write execute command in the write sequence shown in FIG. 6.

FIG. 14 shows an operation timing chart after the write execute command Cmd4 shown in FIG. 12 in the case of write sequence shown in FIG. 6. What is different from that shown in FIG. 13 is that the lower page (ADD1lower) read (Read1, that is, step S110 shown in FIG. 6) is performed after the setup operation. Others are not different from those shown in FIG. 13.

Figure 15:
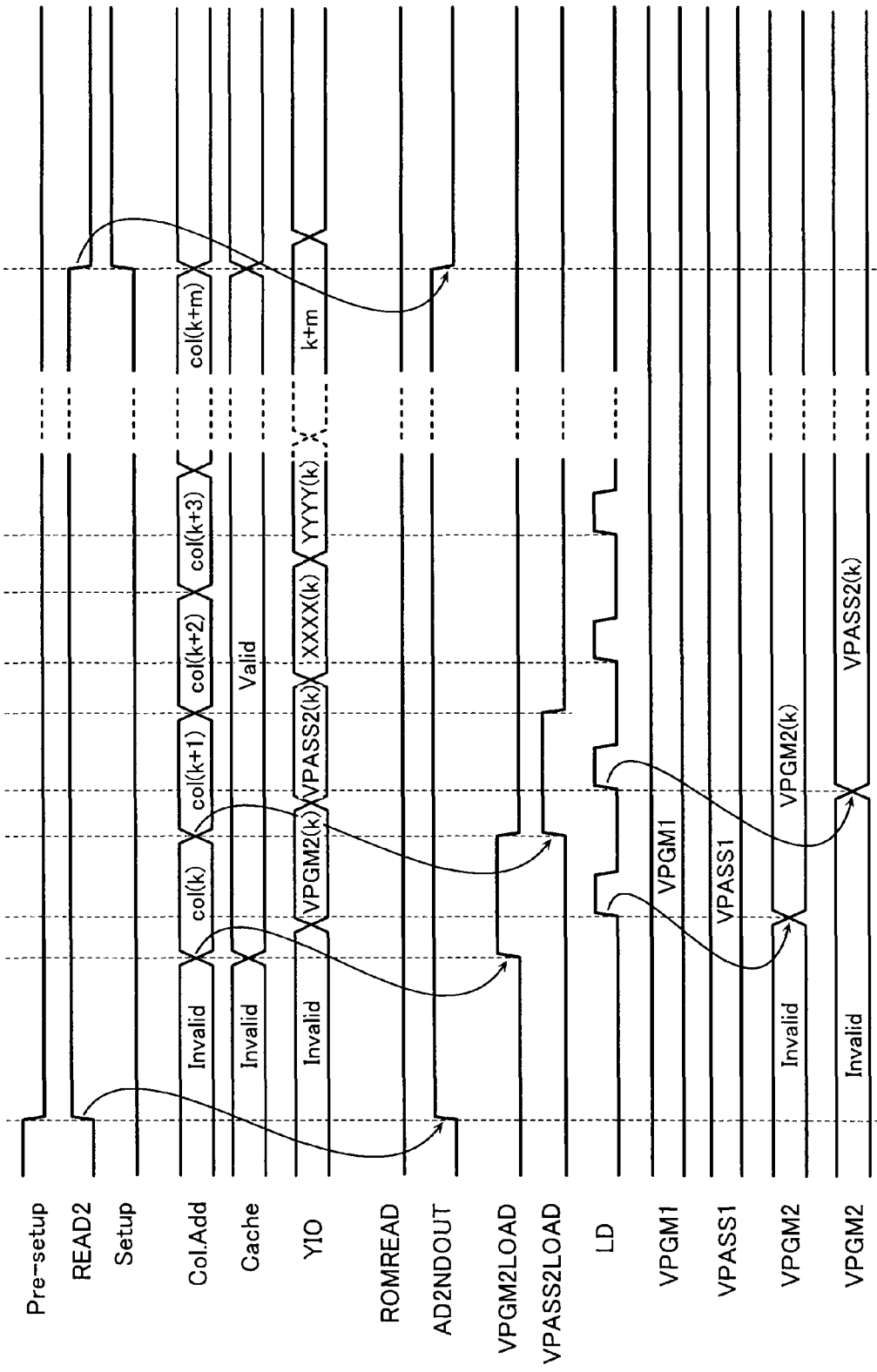
FIG. 15 shows a timing chart of reading the voltage adjusting value data.

FIG. 15 shows a detailed operation timing chart of the voltage adjusting value read (Read2) shown in FIG. 13 and FIG. 14. Register 9 controlled in this read operation has, as shown in FIG. 3, first register group 9-1 used for holding the voltage trimming value data read out the ROM fuse area and second register group 9-2 used for holding the voltage adjusting value data read out in "Read2" operation.

The voltage adjusting value data read is completed until timing "t1" shown in FIG. 15, and one page data storing (Cache) into the sense amplifier circuit 3 is performed. Following it voltage adjusting values at the respective column addresses sequentially selected by the column address counter are latched in the second register group 9-2.

Explaining in detail, column address, col(k) is initially set, and the corresponding data VPGM(k) outputs to data bus YIO. At the same time, a select signal for a certain register input portion, i.e., VPGM2(k) in the example shown in FIG. 15, becomes active (timing "t1"), whereby the latch portion is set in the data input permissible state in place of the latching state.

Then, data on the data bus YIO, i.e., write voltage adjusting value VPGM2(k), is latched in the register with register clock signal LD="H" (timing "t2"). As similar to the above-description, column addresses col(k+1), col(k+2), . . . , col(k+m) are sequentially exchanged, and the corresponding voltage adjusting values will be stored in the corresponding registers. Here, "m" designates the number of the voltage adjusting values required for the presently selected page "k".

Figure 16:
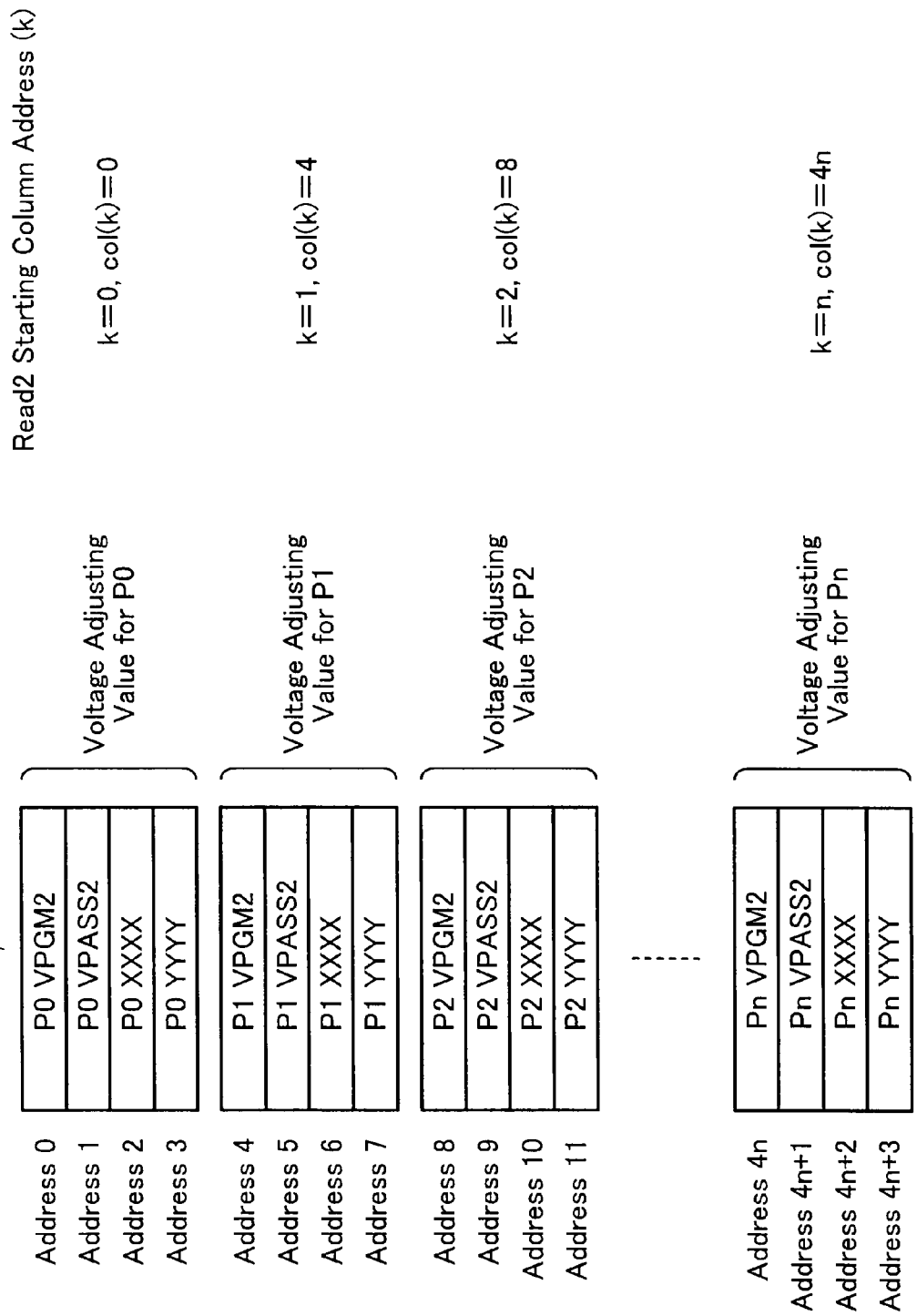
FIG. 16 shows the relationship between the voltage adjusting value data storage area and the column addresses.

FIG. 16 shows the relationship between the voltage adjusting value data storage area 1b set in the user-accessible area in the cell array 1 and the column address counter used for reading the adjusting value data.

It is assumed here that the voltage adjusting data storage area 1b stores one page variables, each of which is an adjusting value formed of 4-Byte data such as VPGM2, VPASS2, XXXX and YYYY in case of m=3. "Page" used here is a physical page, which is defined as a set of cells selected by a word line in a block in the cell array. In case a NAND string is formed of 32 NANDs, one block contains 32 pages (n+1=32).

For example, the address counter is constructed as to change the read-starting address (i.e., column address) of the voltage adjusting value data in association with the write page as follows: in case page P0 is designated as write address (read or erase address), the read-starting address is changed to address "0" (i.e., column address col(k)=0); in case page P1 is designated, it is changed to address "4" (i.e., column address col(k)=4); and in case page P2 is designated, it is changed to address "8" (i.e., column address col(k)=8).

By use of the above-described address counter, it becomes possible to adjust the write voltage and the like at such a specified page that cell properties thereof have been changed due to repeated write/erase operations. For example, there is a possibility that cell properties of a memory cell adjacent to the select gate transistor S0 and another memory cell adjacent to the select gate transistor S1 have been changed. Therefore, it is effective that the write voltage for the corresponding pages is set to be adjustable, and it becomes possible to precisely adjust the control voltages in accordance with the use-history in the cell array.

The voltage adjusting data storage area 1b is a usable block for users, and users are able to rewrite optionally data thereof to designate a block to be written, erased or read. For example, it will be desired that, in consideration of the degradation of cell characteristics generated as a result of the repeated write/erase operations, users rewrite the voltage adjusting value data storage area 1b to have suitable adjusting values in accordance with the number of write cycles.

Figure 17:
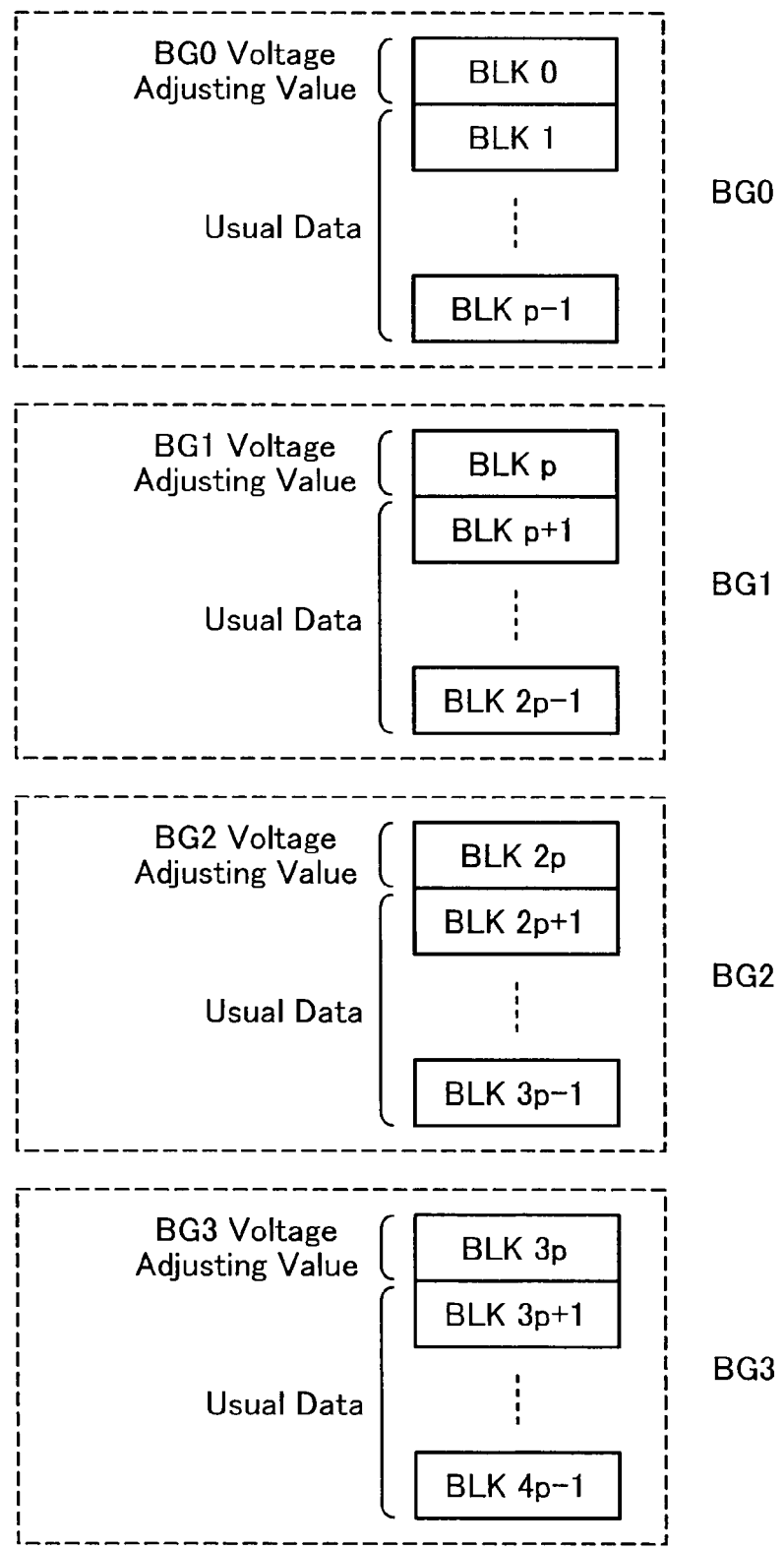
FIG. 17 shows another arrangement example of the voltage adjusting value data storage area.

FIG. 17 shows a detailed example of the above-described voltage adjusting data storage area 1b set in the cell array. The flash memory has a number of blocks, which are, for example, classified into four block groups, BG0~BG3. Each block group is defined by a set of "p" blocks, specified address blocks in the respective groups, for example, the head address blocks, BLK0, BLKp, BLK2p and BLK3p, are selected to constitute the voltage adjusting data storage area. Here, "the head address" designates the head block logical address.

In this case, to read the voltage adjusting value data at, for example, a write time, it is required of the second register part 14-2 shown in FIG. 4 to be constructed with such a function that the head block address is always selected in a selected block group.

It will be explained in detail the second address register part 14-2. Assuming that there are 512 blocks, to designate the block address, it is required of the address signals ROW-ADD1, ROWADD2 and ROWADD shown in FIG. 4 to be formed of nine bits basically. However, in case the voltage adjusting data storage area is fixed at the head block logical address in the block group, it is not required of the address signal ROWADD2 to be formed of 9 bits.

For example, it is assumed that each block group includes 128 blocks (p=128), and four block groups are set in the flash memory with 512 blocks. In this case, the address ROW-ADD2 may be formed of 2 bits. Therefore, the capacity of the second register part 14-2 will be reduced.

Figure 18:
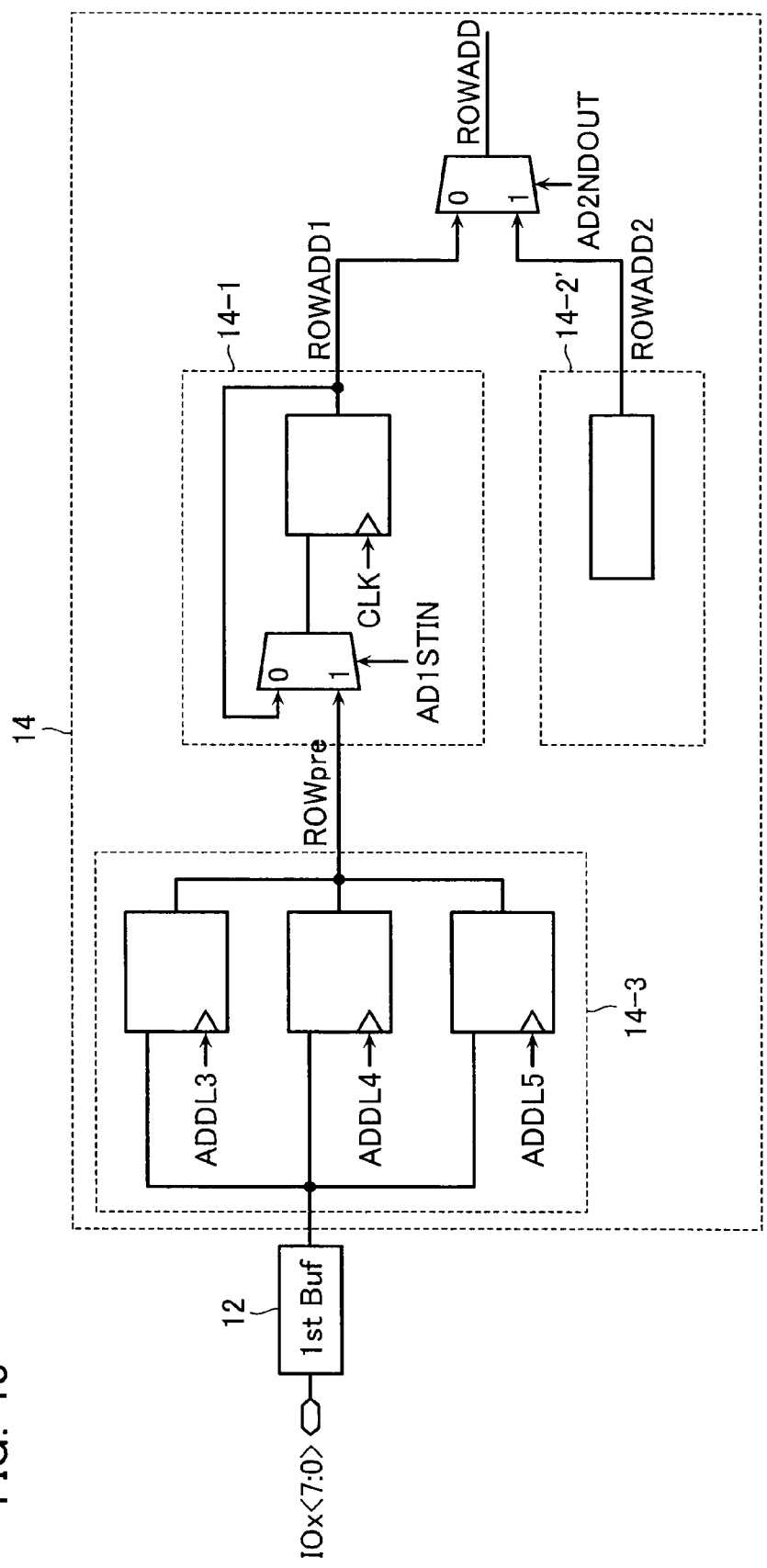
FIG. 18 shows a modified example of the address buffer shown in FIG. 4.

Address register 14 may be modified as shown in FIG. 18. In FIG. 18, address output circuit 14-2' is disposed for outputting a fixed block address in place of the second address register part 14-2 shown in FIG. 4. As shown in this example, in case the voltage adjusting value data storage area is set with a fixed block address, address input for reading the voltage adjusting value and the address register part for storing the input address may be omitted, so that the circuit redundancy will be reduced.

In the example shown in FIG. 16, different column addresses are assigned to the voltage adjusting data storage areas for different page addresses. In this case, if there are a small number of the adjusting voltage values in each page address, the voltage adjusting values may be collected in one page. Although this means that the voltage adjusting value storage is efficient, it is in need of designating the voltage adjusting value read address every time.

Figure 19:
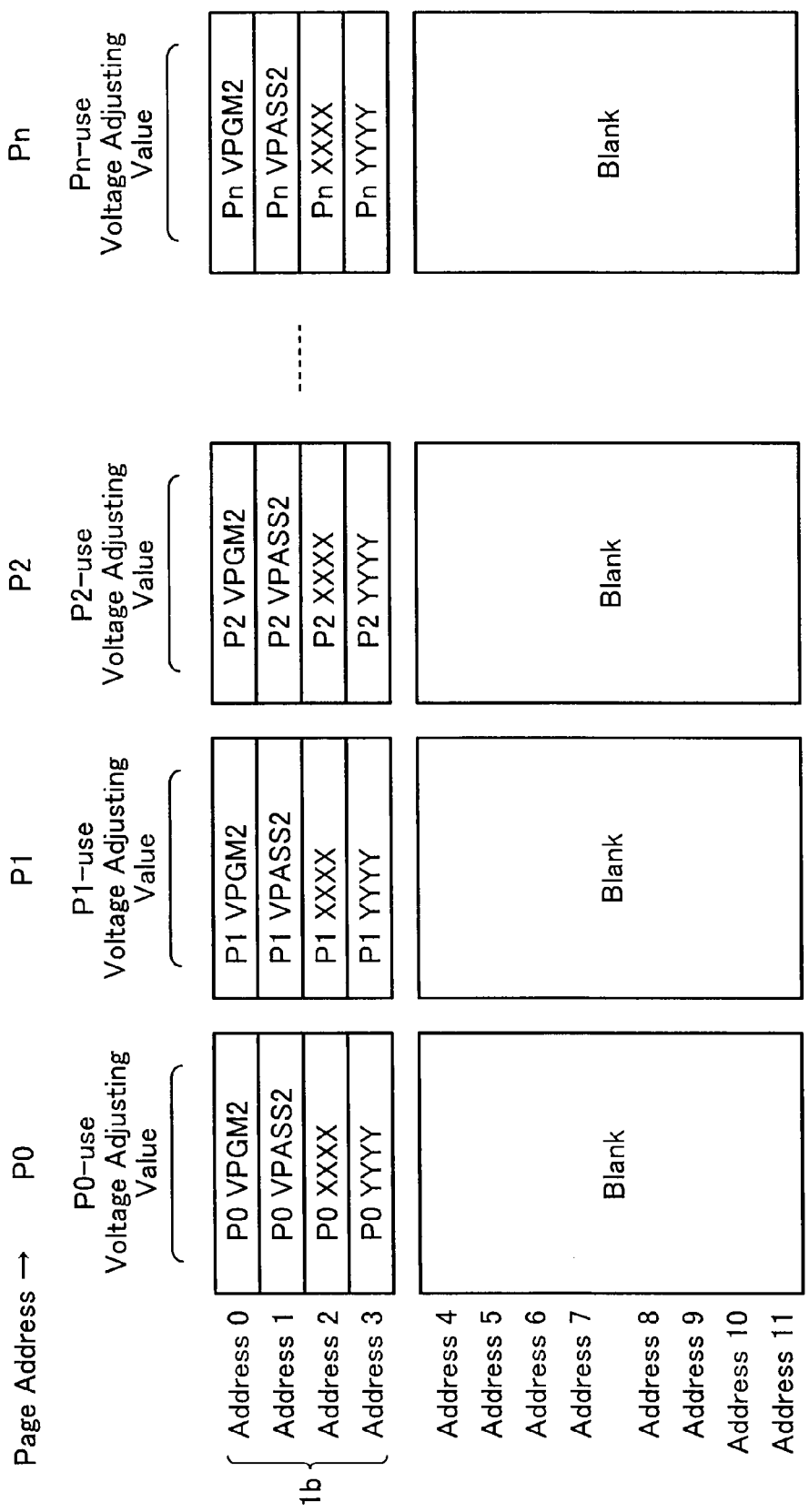
FIG. 19 shows another arrangement of the voltage adjusting value data storage area.

By contrast, FIG. 19 shows a modified address assignment example of the voltage adjusting value storage areas. In this example, the same column addresses "0" to "3" are assigned to the voltage adjusting value data storage areas for different page addresses, and the page addresses used for reading the voltage adjusting values may be generated from those used for, for example, data writing. Therefore, a part of, or the whole of the second address register part 14-2 may be omitted, and it becomes possible to reduce the circuit area. This is effective specifically in such a case that there are a number of the voltage adjusting values.

That is, in case there are many data in the second address register part 14-2, the circuit scheme shown in FIG. 19 is effective for reducing the circuit area.

Further, to prevent the voltage adjusting data storage area from being erroneously erased, it is effective to use a command (erase command or write command) different from that used in other cases.

As described above, according to this embodiment, various kinds of voltage setting values set at the shipping time may be adjusted substantially to be suitable values in accordance with the circumstances, and the life time of the flash memory will be extended.

Next, as an embodiment, an electric card using the non-volatile semiconductor memory devices according to the above-described embodiment of the present invention and an electric device using the card will be described bellow.

Figure 20:
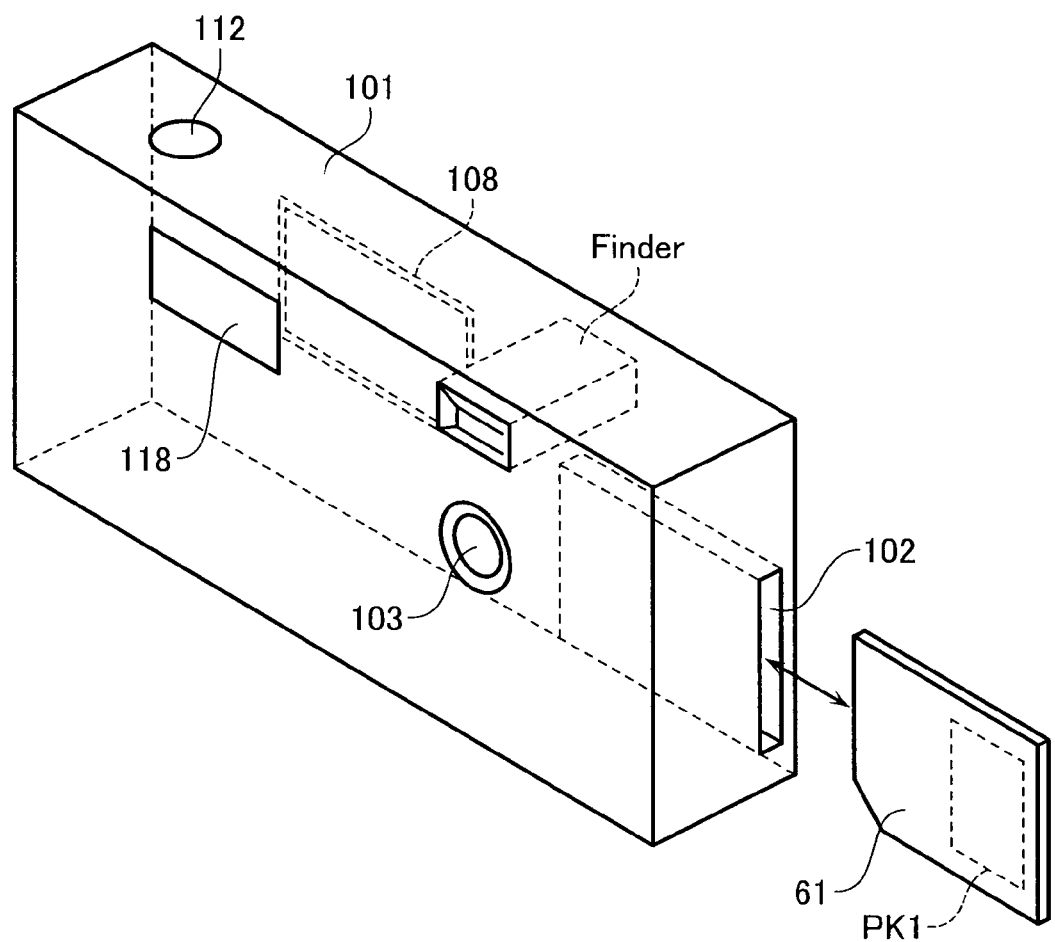
FIG. 20 shows another embodiment applied to a digital still camera.

FIG. 20 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 21:
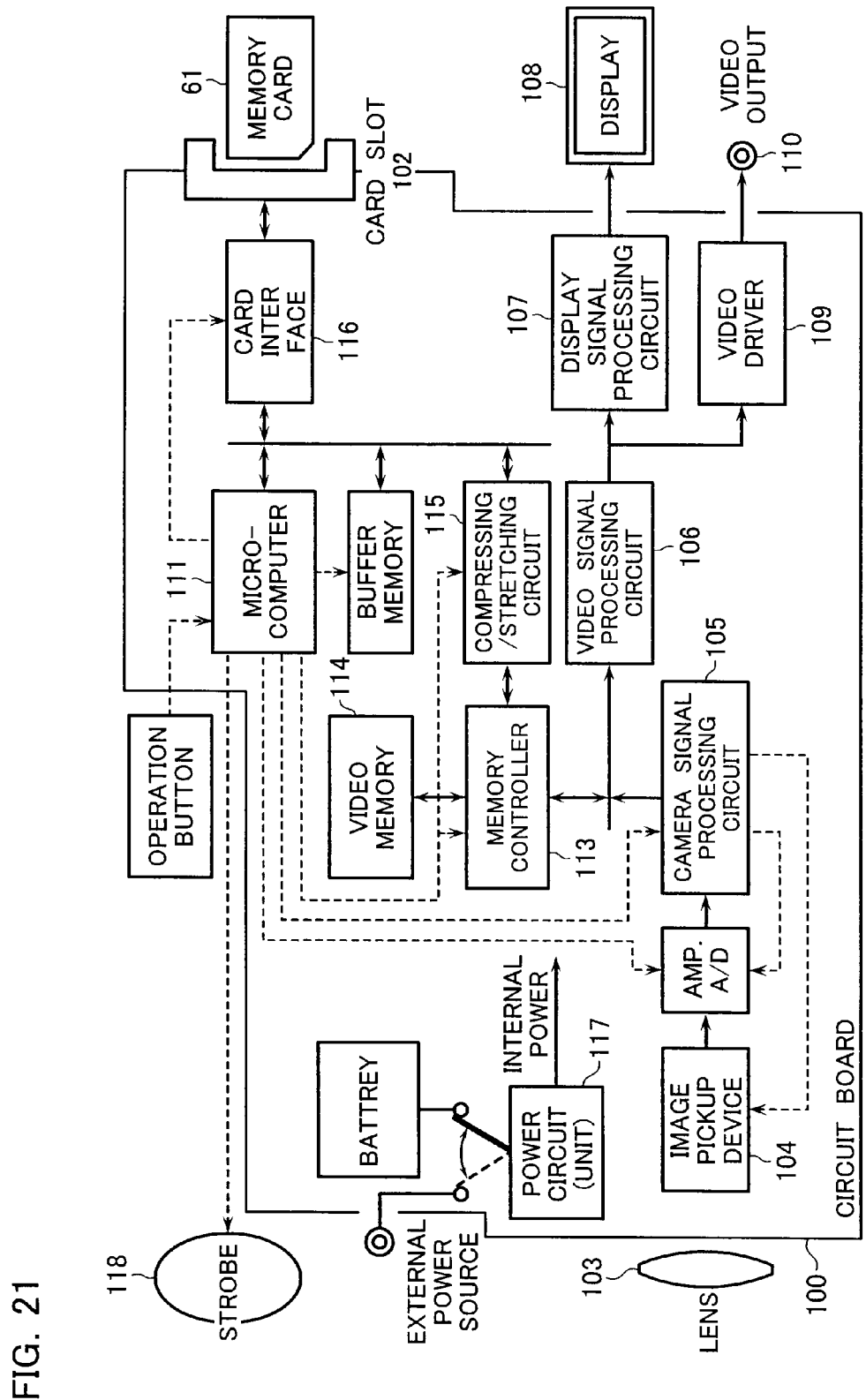
FIG. 21 shows the internal configuration of the digital still camera.
Figure 22A:
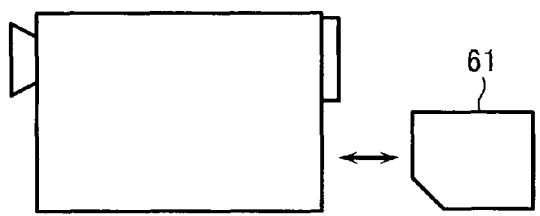
FIGS. 22A to 22J show other electric devices to which the embodiment is applied.
Figure 22F:
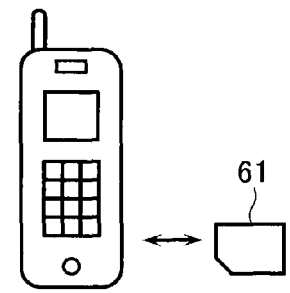
Figure 22B:
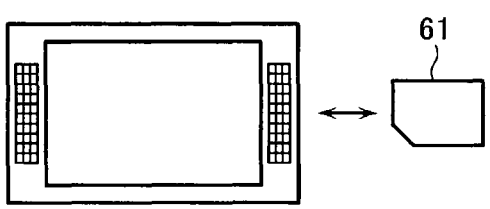
Figure 22G:
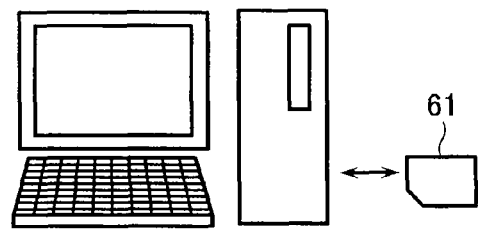
Figure 22C:
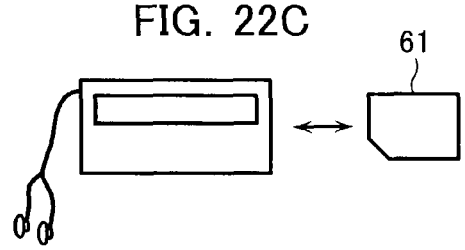
Figure 22H:
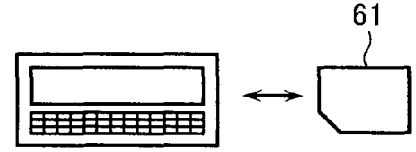
Figure 22D:
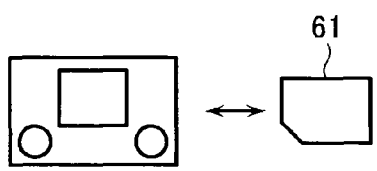
Figure 22I:
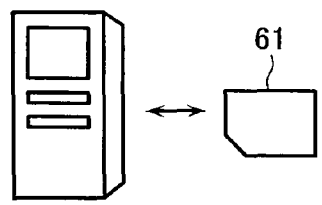
Figure 22E:
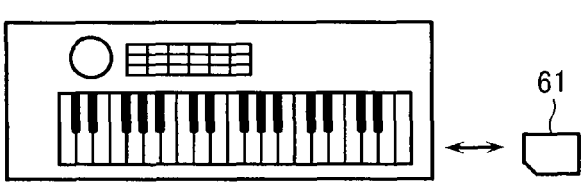
Figure 22J:
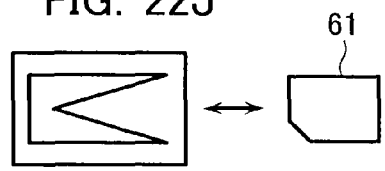

FIG. 21 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 22A to 22J, as well as in portable electric devices. That is, the electric card can also be used in a video camera shown in FIG. 22A, a television set shown in FIG. 22B, an audio apparatus shown in FIG. 22C, a game apparatus shown in FIG. 22D, an electric musical instrument shown in FIG. 22E, a cell phone shown in FIG. 22F, a personal computer shown in FIG. 22G, a personal digital assistant (PDA) shown in FIG. 22H, a voice recorder shown in FIG. 22I, and a PC card shown in FIG. 22J.

This invention is not limited to the above-described embodiments. It will be understood by those skilled in the art that various changes in form and detail may be made without departing from the spirit, scope, and teaching of the invention.

What is claimed is:

1. A non-volatile semiconductor memory device comprising:

a memory cell array with electrically rewritable and non-volatile memory cells arranged therein;

a first register group configured to store control data used for controlling memory operations;

an adjusting data storage area defined in the memory cell array so as to store adjusting data used for adjusting the control data;

a second register group configured to store the adjusting data read from the adjusting data storage area;

a first address register part configured to store first address data input for normally data-reading, data-writing or data-erasing; and a second address register part configured to store second address data input for accessing the adjusting data storage area.

2. The non-volatile semiconductor memory device according to claim 1, further comprising:
a voltage generating circuit configured to generate multiple voltages required correspondingly to the memory operations, wherein
the control data are voltage trimming data to be supplied to the voltage generating circuit, the voltage trimming data being preliminarily written in the memory cell array and read out to be held in the first register group at a power-on reset time.

3. The non-volatile semiconductor memory device according to claim 2, wherein
the adjusting data storage area is set in a user-accessible area in the memory cell array, and the adjusting data contain voltage adjusting data used for adjusting the voltage trimming data, the voltage adjusting data being read out prior to a normal data read, write or erase operation and held in the second register group.

4. The non-volatile semiconductor memory device according to claim 3, wherein
the voltage trimming data held in the first register group are adjusted by the corresponding voltage adjusting data held in the second register group and applied to the voltage generating circuit.

5. The non-volatile semiconductor memory device according to claim 1, wherein
the second address data is input for reading the adjusting data previously to the first address data in a normal data read, write or erase operation.

6. The non-volatile semiconductor memory device according to claim 3, wherein
the user-accessible area comprises a plurality of block groups, each of which includes multiple blocks, specified blocks, to which specified addresses are assigned in the respective block groups, constituting the adjusting data storage area.

7. The non-volatile semiconductor memory device according to claim 1, wherein
the second address register part is an address output circuit configured to output the second address data, which are fixedly set.

8. The non-volatile semiconductor memory device according to claim 1, wherein
the memory cell array comprises NAND cell units arranged therein, the NAND cell unit having a plurality of the memory cells connected in series.

9. The non-volatile semiconductor memory device according to claim 8, wherein
the memory cell stores multiple bits.

10. A non-volatile semiconductor memory device comprising:
a memory cell array with electrically rewritable and non-volatile memory cells arranged therein;
a voltage generating circuit configured to generate multiple voltages required correspondingly to the memory operations;
a first register group configured to store voltage trimming values supplied to the voltage generating circuit; and
a second register group configured to store voltage adjusting values used for adjusting the voltage trimming values, wherein
the voltage trimming values are preliminarily written in a ROM fuse area disposed in the memory device and read out to be held in the first register group at a power-on reset time.

11. The non-volatile semiconductor memory device according to claim 10, wherein
the voltage adjusting values are preliminarily stored in a specified user-accessible area defined in the memory cell array, and read out in accordance with a specified access cycle to be held in the second register group.

12. A non-volatile semiconductor memory device comprising:
a memory cell array with electrically rewritable and non-volatile memory cells arranged therein;
a voltage generating circuit configured to generate multiple voltages required correspondingly to the memory operations;
a first register group configured to store voltage trimming values supplied to the voltage generating circuit; and
a second register group configured to store voltage adjusting values used for adjusting the voltage trimming values, wherein
the voltage adjusting values are preliminary stored in a specified user-accessible area defined in the memory cell array, and read out in accordance with a specified access cycle to be held in the second register group, and wherein
the memory device further comprises:
a first address register part configured to store first address data input for normally data-reading, data-writing or data-erasing; and
a second address register part configured to store second address data input for reading the voltage adjusting values in the specified user-accessible area.

13. The non-volatile semiconductor memory device according to claim 12, wherein
the specified access cycle is performed previously to the first address data input.

14. The non-volatile semiconductor memory device according to claim 11, wherein
the specified user-accessible area is formed of specified blocks with specified addresses assigned in a plurality of block groups, each of which includes multiple blocks.

15. The non-volatile semiconductor memory device according to claim 12, wherein
the second address register part is an address output circuit configured to output the second address data, which are fixedly set.

16. The non-volatile semiconductor memory device according to claim 10, wherein
the memory cell array comprises NAND cell units arranged therein, the NAND cell unit having a plurality of the memory cells connected in series.

17. The non-volatile semiconductor memory device according to claim 16, wherein
the memory cell stores multiple bits.

18. The non-volatile semiconductor memory device according to claim 1, wherein
the adjusting data storage area stores a plurality of the adjusting data each of which corresponds to one or plural erase units of the memory cells.

* * * * *